United States Patent
Yamamoto et al.

(10) Patent No.: US 7,038,610 B2
(45) Date of Patent: May 2, 2006

(54) INTEGRATION TYPE A/D CONVERTER, AND BATTERY CHARGER UTILIZING SUCH CONVERTER

(75) Inventors: Kenji Yamamoto, Kyoto (JP); Nobutoshi Shimamura, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 687 days.

(21) Appl. No.: 10/198,507

(22) Filed: Jul. 16, 2002

(65) Prior Publication Data
US 2003/0016151 A1    Jan. 23, 2003

(30) Foreign Application Priority Data
Jul. 19, 2001   (JP)   ............................. 2001-219231
Jul. 19, 2001   (JP)   ............................. 2001-219232

(51) Int. Cl.
*H03M 1/82*   (2006.01)

(52) U.S. Cl. ....................... 341/167; 341/141; 341/166

(58) Field of Classification Search ................ 341/126, 341/127, 166, 167
See application file for complete search history.

(56) References Cited

U.S. PATENT DOCUMENTS

| | | | | |
|---|---|---|---|---|
| 3,875,503 A | * | 4/1975 | Hayashi | 324/607 |
| 4,357,600 A | * | 11/1982 | Ressmeyer et al. | 341/129 |
| 4,361,831 A | * | 11/1982 | Grutzediek et al. | 341/131 |
| 4,568,913 A | * | 2/1986 | Evans | 341/118 |
| 4,617,550 A | * | 10/1986 | Glincman | 341/167 |
| 4,731,602 A | * | 3/1988 | Hata | 341/166 |
| 4,814,692 A | * | 3/1989 | Baumann | 324/607 |
| 5,014,058 A | * | 5/1991 | Horn | 341/166 |
| 5,182,561 A | * | 1/1993 | Sasaki | 341/166 |
| 5,229,771 A | * | 7/1993 | Hanlon | 341/166 |
| 5,448,239 A | * | 9/1995 | Blumberg et al. | 341/166 |
| 5,537,113 A | * | 7/1996 | Kawabata | 341/141 |
| 5,565,869 A | * | 10/1996 | Brodie et al. | 341/168 |
| 6,285,310 B1 | * | 9/2001 | Michaelis et al. | 341/166 |
| 6,693,577 B1 | * | 2/2004 | Yamamoto | 341/155 |

\* cited by examiner

*Primary Examiner*—Peguy Jeanpierre
*Assistant Examiner*—Khai Nguyen
(74) *Attorney, Agent, or Firm*—Hogan & Hartson, LLP

(57) ABSTRACT

An integration type A/D converter has two sets of integration type A/D converter sections which can be periodically switched over at a predetermined period, with one converter section integrating an input signal to give an integral output voltage and another converter section performing A/D conversion of the integral output voltage. Further, use is made of a residual time interval in the period of A/D conversion, for the integration of the ground voltage and a reference voltage and for A/D conversions of the integrated voltages. The inventive A/D converter permits accurate measurement of continuous integral values of a given input signal.

6 Claims, 14 Drawing Sheets

FIG. 9

| BIT NO. | 1 | 2 | ... | 17 | 18 | 19 | 20 | 21 | 22 |
|---|---|---|---|---|---|---|---|---|---|
| CONTENT | +/- SIGN | COUNT DATA | | | | ch | Vin GRAND REFERENCE | | (NOT IN USE) |

INTEGRATION TYPE A/D CONVERTER, AND BATTERY CHARGER UTILIZING SUCH CONVERTER

FIELD OF THE INVENTION

The invention relates to an integration type A/D converter, and a battery charger utilizing the integration type A/D converter, suitable for measurement of integrated DC current.

BACKGROUND OF THE INVENTION

Batteries are used in a variety of fields including notebook type personal computers (PC), personal digital assistants (PDAs), digital still cameras (DSC), smart-phones, electric automobiles, and motor-assisted bicycles.

Batteries such as lithium ion batteries for use in notebook PCs are likely to burst if they are overcharged during charging. On the other hand, if they are discharged exceedingly above its allowable limit, their charging/discharging characteristics are deteriorated.

In order to circumvent such incidents, and take advantages of the battery performance, appropriate charging and discharging control suitable for the charging/discharging characteristics is required. For this purpose, there have been implemented in the past measurement devices for monitoring charging and discharging status of batteries.

A typical discrete measurement device measures a charging/discharging current that varies over a wide range (e.g.0.5 mA–15 A), converts it to a voltage (5 µV–150 mV) and holds sampled voltage after it is amplified. This type of measurement device also includes a micro-controller unit (MCU) for converting the voltage into a digital signal by means of a multi-bit (e.g. 10 bits) sequential comparison type A/D converter and for averaging the data obtained.

Since the conventional measurement device integrates the charging/discharging current by accumulating the product of sampled discrete value and the sampling period, the integrated value inevitably has an error. In addition, precise measurement is difficult due to the fact that, since the dynamic range of the input signal is large, the measurement is influenced by a persistent weak current and noise. Further, in order to obtain practical accuracy in the averaging process, it is necessary to repeat a prolonged measurement using an MCU that consumes a fairly large current, which makes it difficult to reduce energy consumption.

FIG. 1 is a block diagram showing a conventional integration type A/D converter for integrating a continuous variable and converting it into a digital variable through A/D conversion. FIG. 2 is a timing diagram of the converter.

As seen in FIGS. 1 and 2, the integration circuit 701 of the converter is initially reset, providing zero Volt as the output Ea thereof (the output of the integration circuit hereinafter referred to as integral output voltage). Under this condition, a start pulse s is applied to a flip-flop 703, which turns on switch S1 and turns off switch S2 to couple the converter to an input signal Ei. Then the integration circuit 701 starts integration of the input signal Ei, generating an output voltage −Ei/RC. If the output Ea exceeds a comparative voltage −ΔVt, a comparative pulse p is generated, starting a first period of integration (the period hereinafter referred to as integration period). The integration period Ts is the time basis of the measurement.

AND circuit 706 is now opened to cause counter 704 to count the number of clock pulses issued from clock generator 705. As the count of the counter 704 reaches an overflow value Nm after a period Ts, an overflow pulse r is generated to reset the flip-flop 703.

Next, the switch S1 is turned off and switch S2 turned on, switching the connection to a reference voltage of −Es, starting the integration of the current in a second integration period T. This results in an output of the integration circuit 701 having an opposite slope Es/RC as compared with the first integration. As the output Ea returns to −ΔVt, the output of comparator 702 is inverted, closing the AND circuit 706. During this period, the counter 704 has been again counting the clocks starting from 1 after the overflow. The count N of the counter 704 at the time the AND circuit 706 is closed is proportional to the input signal Ei.

The value of the integration obtained by the integration circuit 701 in the first half of the integration is proportional to the level of the input signal Ei, while in the second half integration in the reverse direction the period T of integration is proportional to the level of the input signal Ei. That is, Ei·Nm=Es·N. Thus, the input signal Ei (=N·Es/Nm) is A/D converted by counting the clock pulses N during the period T. Such conventional integration type A/D converter has advantages in that it is not costly assembled and not strongly influenced by noise.

The conventional A/D converter requires, in addition to integration periods for integrating input signal, a reverse integration time (i.e. time for A/D conversion) for discharging the integrated charge. Hence, the measurement of an integrated value of a continuous input signal involves time interval in which no A/D conversion is made.

On account of these intervals, it is difficult to obtain accurate integration of the input signal if a compensation is made for the intervals by, for example, averaging the input signal over the intervals. Particularly, in the measurement of charging/discharging current of a battery, this can be a source of a large error, since then the input signal varies over a wide range.

In addition, data varies in conventional analog A/D converter due to offsets and fluctuations in characteristics of the amplifiers and comparators used, and due to a change in temperature.

For these reasons, it has been difficult to improve the accuracy of the measurements.

SUMMARY OF THE INVENTION

An integration type A/D converter in accordance with one aspect of the invention comprises:

a first integration type A/D conversion section for providing an A/D conversion data, said A/D conversion section adapted to integrate a supplied signal to generate an integral output voltage, bringing said integral output voltage back to the initial level thereof by a predetermined magnitude per unit time, and measuring the time to restore said initial level, said A/D conversion section further adapted to provide said measured time as said A/D conversion data;

a second integration type A/D conversion section for providing an A/D conversion data, said A/D conversion section adapted to integrate a supplied signal to generate an integral output voltage, bringing said integral output voltage back to the initial level thereof by a predetermined magnitude per unit time, and measuring the time to restore said initial level, said A/D conversion section further adapted to provide said measured time as said A/D conversion data;

an input section receiving an input signal, adapted to alternately supply said input signal to said first integration type A/D conversion section and said second A/D conversion section during predetermined periods;

an output section receiving from said first integration type A/D conversion section said first A/D conversion data for said input signal and receiving from said second integration type A/D conversion section said second A/D conversion data for said input signal, said output section adapted to output said first and second A/D conversion data; and a control section connected to said input section, said first, integration type A/D conversion section, said second integration type A/D conversion section, and said output section, to control each of said sections.

An integration type A/D converter in accordance with another aspect of the invention comprises;

a first integration type A/D conversion section for providing an A/D conversion data, said A/D conversion section adapted to integrate a supplied signal to generate an integral output voltage, bringing said integral output voltage back to the initial level thereof by a predetermined magnitude per unit time, and measuring the time to restore said initial level, said A/D conversion section further adapted to provide said measured time as said A/D conversion data;

a second integration type A/D conversion section for providing an A/D conversion data, said A/D conversion section adapted to integrate a supplied signal to generate an integral output voltage, bringing said integral output voltage back to the initial level thereof by a predetermined magnitude per unit time, and measuring the time to restore said initial level, said A/D conversion section further adapted to provide said measured time as said A/D conversion data;

an input section receiving an input signal, adapted to alternately supply said input signal to said first integration type A/D conversion section and said second A/D conversion section during predetermined periods, said input section equipped with a reference signal and further adapted to supply said reference signal to either one of said first and second integration type A/D conversion sections which is not currently receiving said input signal;

an output section receiving from said first integration type A/D conversion section said first A/D conversion data for said input signal and said A/D conversion data for said reference signal, and receiving from said second integration type A/D conversion section said second A/D conversion data for said input signal and A/D conversion data for said reference signal, said output section adapted to output said A/D conversion data received; and a control section connected to said input section, said first integration type A/D conversion section, said second integration type A/D conversion section, and said output section, to control each of said sections.

A battery charger in accordance with still another aspect of the invention utilizes an A/D converter as described above.

BRIEF DESCRIPTION OF THE DRAWINGS

Preferred embodiments of the invention will now be described in detail by way of example with reference to accompanying drawings, in which:

FIG. 9 shows a data format in the second embodiment;

DETAILED DESCRIPTION OF THE PREFERRED EMBODIMENT

Figure 1:
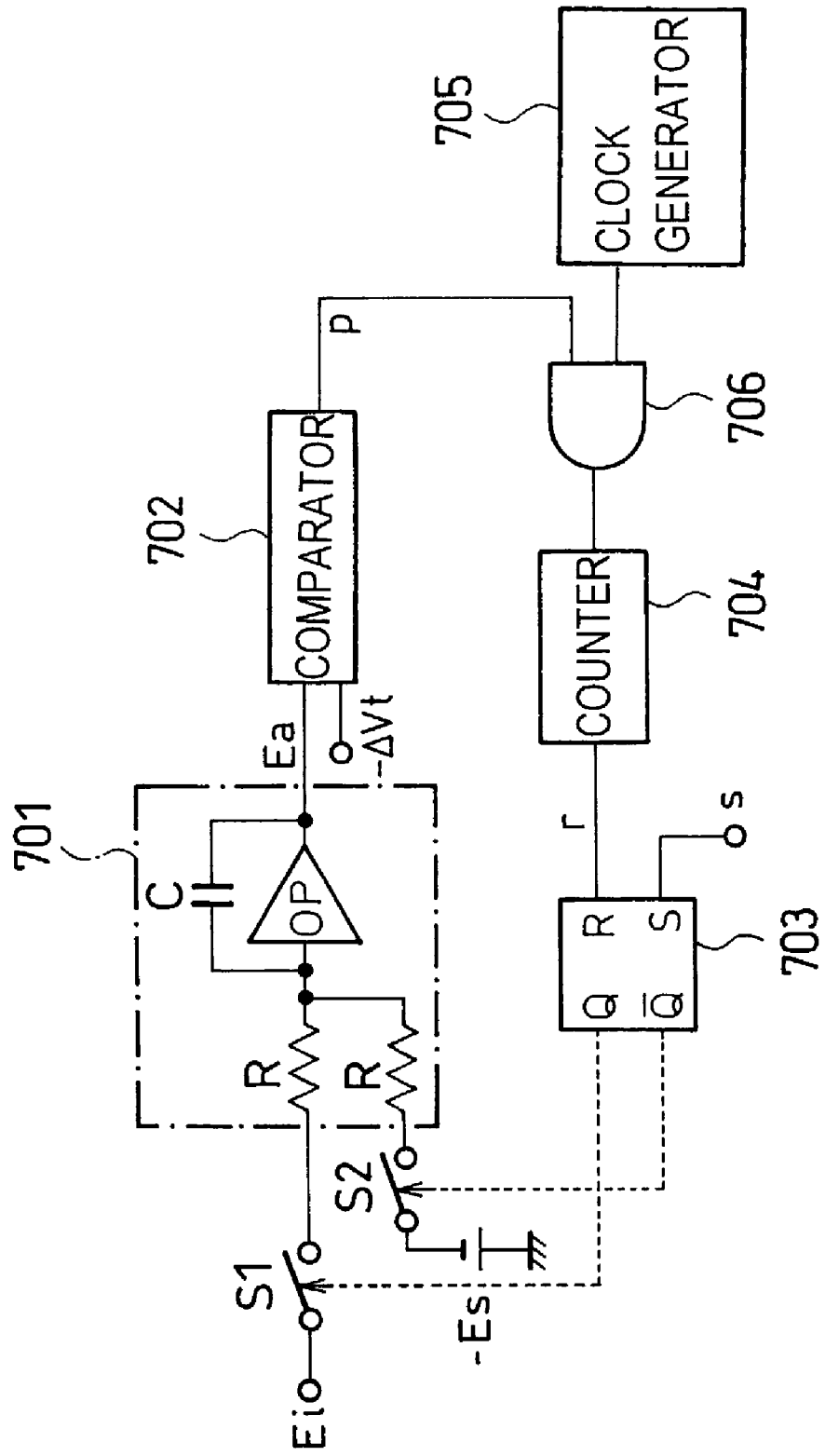
FIG. 1 is a block diagram representation of a conventional A/D converter.
Figure 2:
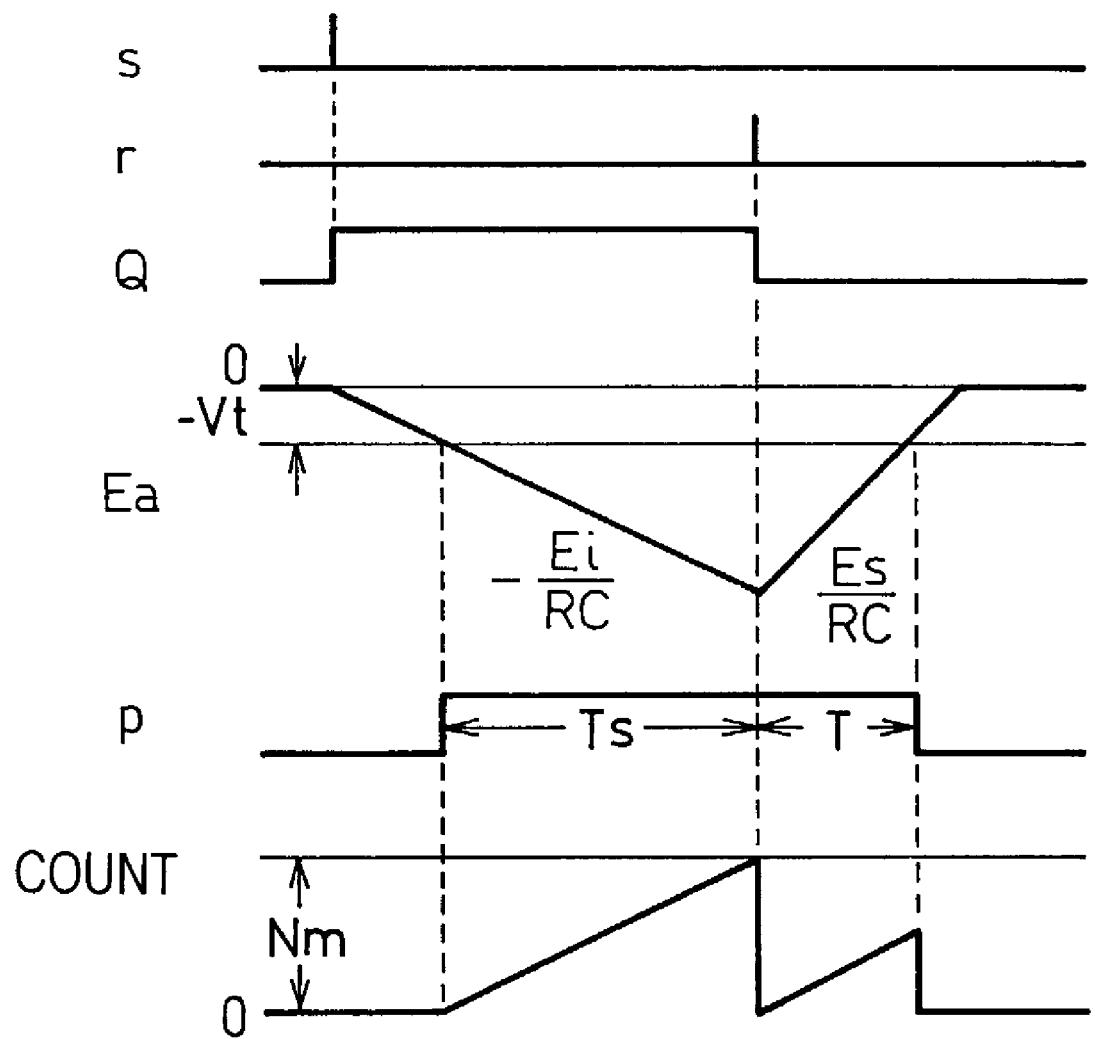
FIG. 2 is a timing diagram of the A/D converter of FIG. 1.
Figure 3:
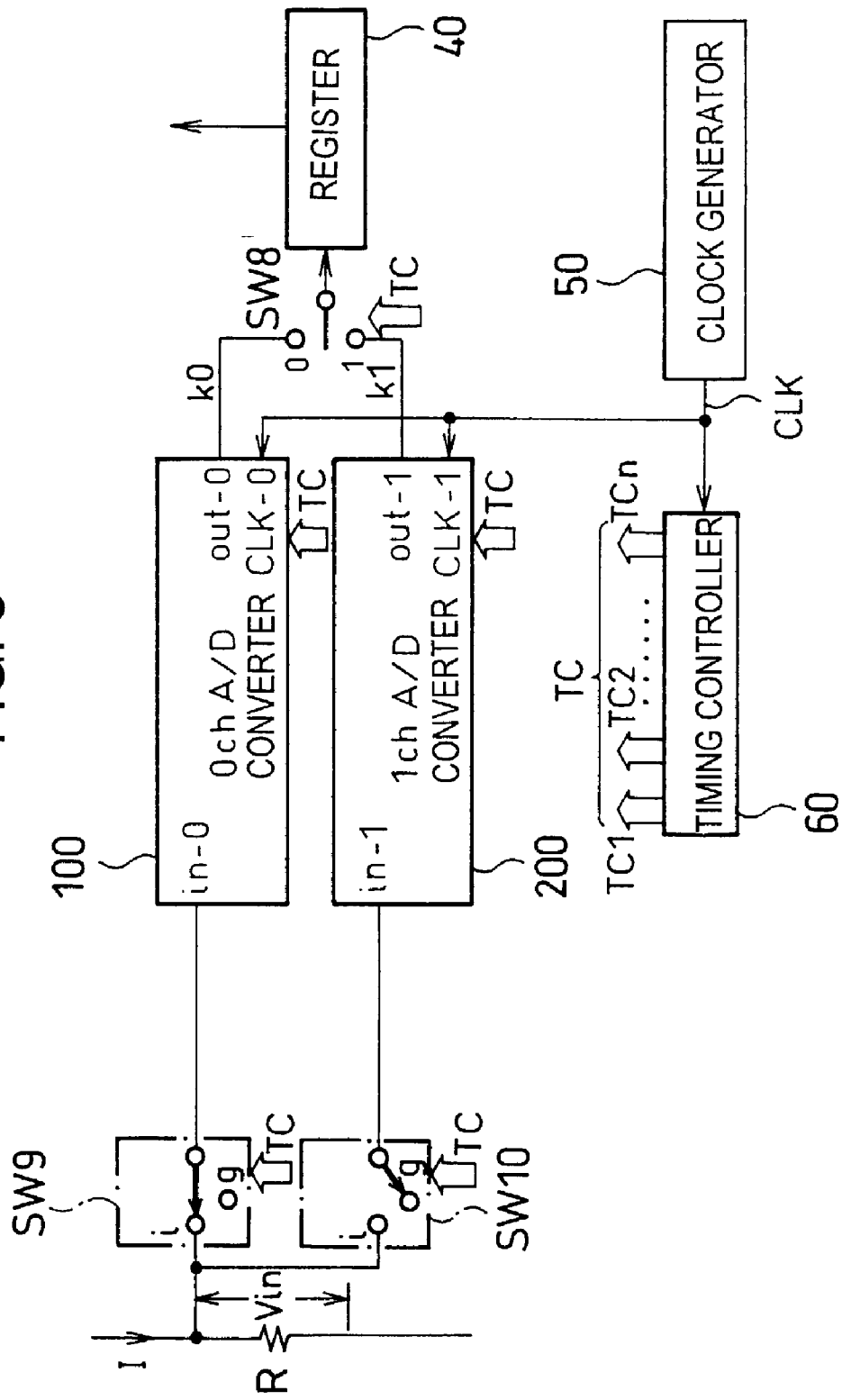
FIG. 3 is a block diagram representation of a first embodiment of an integration type A/D converter according to the invention.
Figure 4:
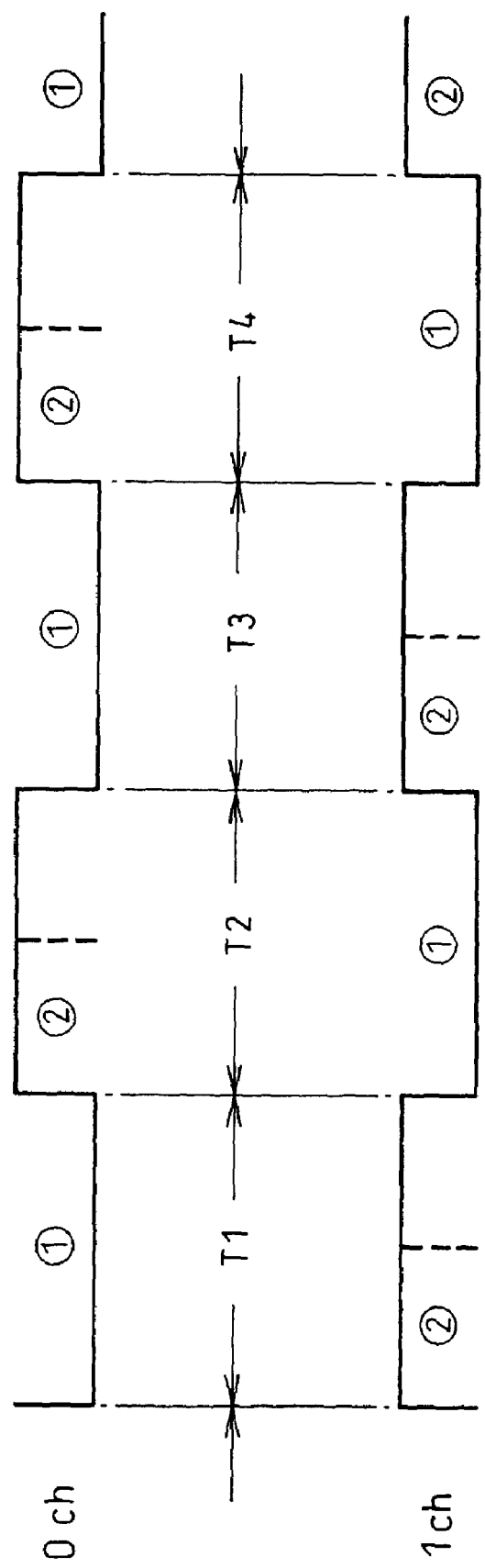
FIG. 4 is a timing diagram of the first embodiment of the integration type A/D converter shown in FIG. 3.
Figure 5:
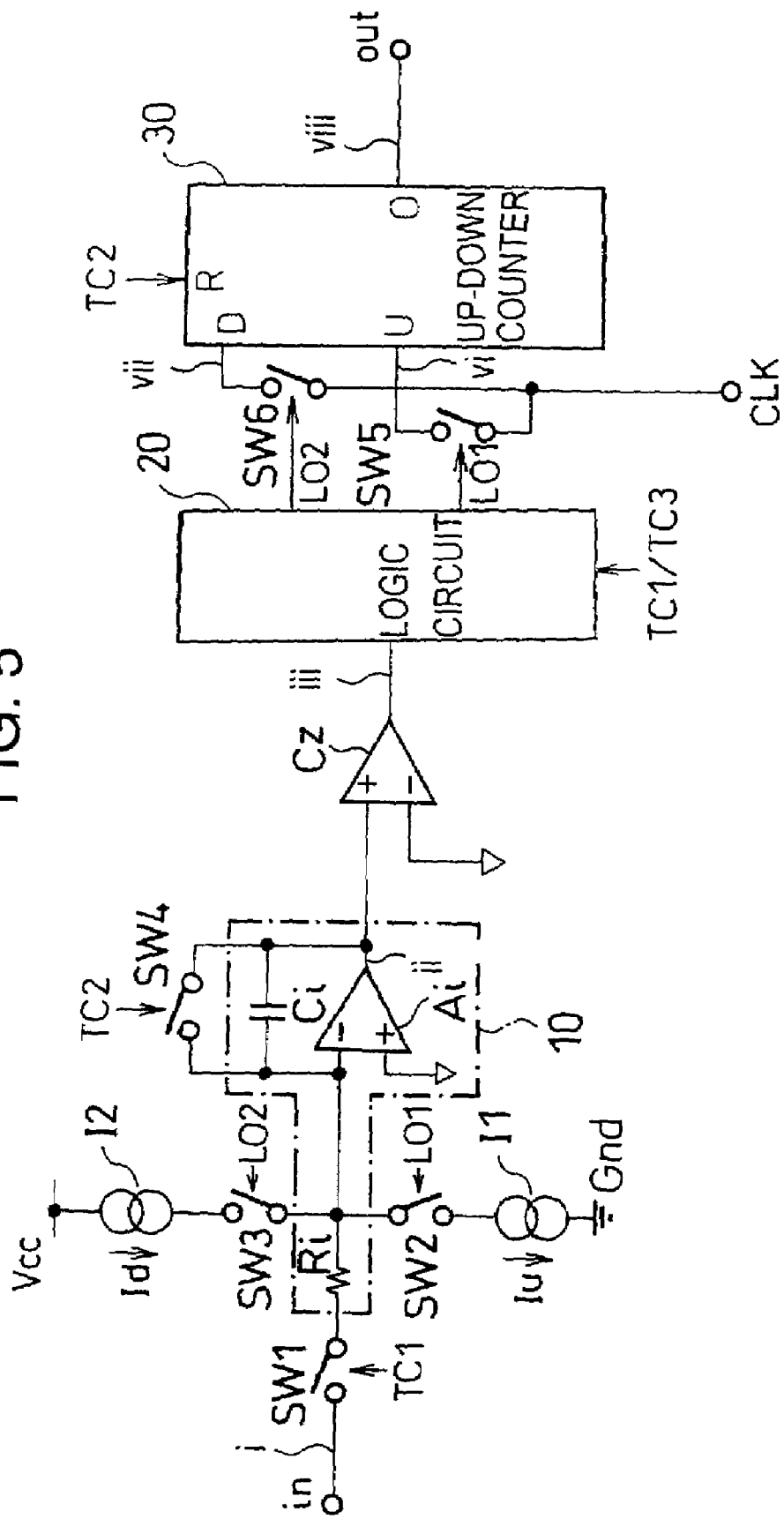
FIG. 5 is a block diagram representation of the first embodiment of the integration type A/D conversion section according to the invention.
Figure 6:
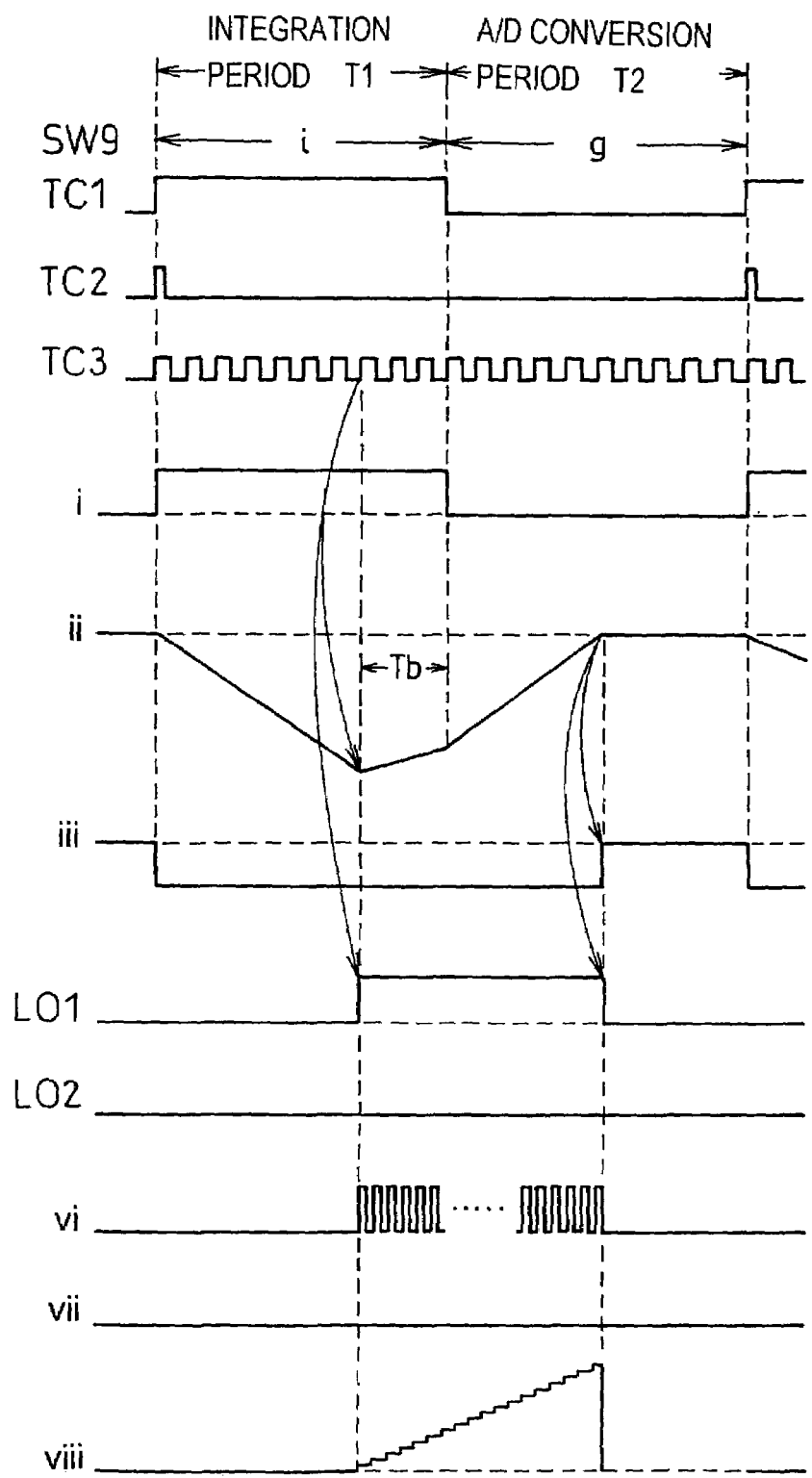
FIG. 6 is a timing diagram of the integration type A/D conversion section of FIG. 5.

FIG. 3 is a block diagram representation of a first embodiment of an integration type A/D converter according to the invention. FIG. 4 is a timing diagram of the A/D converter. FIG. 5 is a block diagram showing the internal structure of a respective A/D conversion section. FIG. 6 is a timing diagram of the respective A/D conversion section.

As shown in FIGS. 3 and 4, a DC current I flows through a current detection resistor R, generating an input voltage Vin across the resistor R. The DC current I may have positive and negative polarities during charging and discharging of a battery, and ranges typically from 0.5 mA to 15 A. The input voltage Vin also changes with the current accordingly.

The input voltage Vin is periodically switched by means of input switching means or switches SW9 and SW10 at a predetermined period T (T1, T2 . . . ) so that it is supplied alternately to either the 0-channel A/D conversion section (hereinafter referred to as 0ch conversion section) 100 or 1-channel A/D conversion section (hereinafter referred to as 1ch conversion section) 200.

The 0ch conversion section 100 and 1ch conversion section 200 are integration type A/D conversion sections, receiving various kinds of timing signals TC and clock signal CLK. They receive at the input terminal in-0 (in-1) thereof an input signal, and integrate the signal for a predetermined period T1 (T2) and A/D convert the integrated value in a predetermined period T2 (T3) that follows. The values of the A/D conversions k0 and k1 are provided at their output terminals out0 and out1, respectively. Both conversion sections 100 and 200 provide a register 40 with positive and negative A/D conversion data including the signs of data, conversion section identification codes, data identification codes, and the like.

The register 40 is provided with values k0 and k1 of the A/D conversion performed by the conversion section currently connected by a switch SW8, along with additional relevant information, and outputs registered data. The switch SW8 is timed by a timing signal TC so that it is connected to either one of the output terminals out0 and out1 every time the current A/D conversion associated with one integration value is finished.

A clock generator 50 provides the respective counters of the respective A/D conversion sections 100, 200 and a timing controller 60 with a clock signal CLK which is used as the time basis. Upon receipt of the clock signal CLK and external operational signals applied as needed, the timing controller 60 generates various timing signals TC (TC1–TCn), which are supplied to relevant components of the converter as shown in FIG. 3. The timing controller 60 communicates with 0ch conversion section 100 and 1ch conversion section 200 and provides the timing signals TC in accordance with the status of the A/D conversion sections 100 and 200.

FIG. 5 shows the internal structures of the 0ch and 1ch A/D conversion sections 100 and 200. The voltage signal i applied to the input terminal $i_n$ is supplied to an integrator 10 via a switch SW1. The switch SW1 is set ON by the timing signal TC1 during integration.

The integrator 10 consists of a high resistance input resistor Ri, a difference amplifier Ai, and a condenser Ci connected between the input and output terminals of the amplifier Ai, to function as an integration amplifier. The non-inverting input terminal of the amplifier Ai is coupled to a ground potential Vgnd or a predetermined bias potential. Connected between the terminals of the condenser Ci is a switch SW4, which is temporarily closed to eliminate charges that remain on the condenser Ci prior to the initiation of a new integration period.

A constant current Id is supplied, via a switch SW3, to the inverting input terminal of the amplifier Ai from a constant current source j2 connected to a power supply Vcc. When the output voltage ii of the integrator 10 is positive, the switch SW3 is turned on during the A/D conversion. A constant current Iu is supplied, via a switch SW2, to the inverting input terminal of the amplifier Ai from a constant current source I1 connected between the terminal and the ground potential Vgnd. When the integration output voltage is of negative polarity, the switch SW2 is turned on during an A/D conversion.

Mostly, the constant currents Iu and Id have the same magnitude, which is determined by the magnitude of the input current associated with the input signal Vin and the dynamic range of the integrator used. For example, for a charge accumulated on the condenser Ci by the input current associated with the input signal Vin during an integration period T1, the output of the integrator 10 is set to be within its dynamic range. That is, $$\{(Vin/Ri)-Iu\} \times T0/Ci \leq \text{(Output dynamic range of integrator 10)}.$$

The integral output voltage ii is supplied to the non-inverting input terminal of a comparator Cz, and the ground potential Vgnd or the predetermined bias voltage Vb is supplied to the inverting input terminal. The comparator Cz outputs its comparative output iii in accordance with whether the integral output voltage ii is positive or negative, or whether the integral output voltage ii is higher or lower than the voltage Vb. Incidentally, since the comparator Cz is provided to determine if the integral output voltage ii is in a predetermined range of voltage near zero (i.e. substantially zero), the comparator Cz can be replaced any means so long as it provides this function.

A control logic circuit 20 (hereinafter referred to as logic circuit 20) provides an up-count signal LO1 and a down-count signal LO2. The up-count signal LO1 is turned on while the integral output voltage ii is of negative polarity, and during a period which begins a predetermined time Tb prior to the termination of the integration period for the input signal and ends when the comparative output iii is inverted. The down-count signal LO2 is turned on while the integral output voltage ii is of positive polarity, and during a period which begins a predetermined time Tb prior to the termination of the integration period for the input signal and ends when the comparative output iii is inverted. The magnitude of the predetermined period Tb is appropriately determined by the magnitudes of the input signal Vin, constant currents Iu and Id. The period Tb can be zero.

Alternatively, the integral output voltage ii can be determined by detecting it exceeding predetermined positive and negative voltages by use of comparators (referred to as positive and negative voltage detection comparators, respectively) for detecting a given positive and a given negative voltage along-with the comparator Cz. In this case, for example, the negative voltage detection comparator generates a first comparator output when the integral output voltage ii exceeds a first negative level, and the comparator Cz generates a second comparative output when the integration output voltage ii is substantially zero. During a period after the generation of the first comparative output until the generation of the second comparative output, the integration output voltage ii is reduced in absolute value while generating an up-count signal.

The negative voltage detection comparator and the comparator Cz may be replaced by a single comparator C which has a hysteresis that the comparator C rises when the integral output voltage ii exceeds in absolute value a first predetermined voltage Em and falls when the integral output voltage ii later has reached a second predetermined voltage.

An up-down counter (hereinafter referred to as U/D counter) 30 includes an up-count terminal U, a down-count terminal D, a count output terminal O, and a reset terminal R. The reset terminal R is applied with a timing signal TC2 for resetting the count of the U/D counter 30 at the beginning of a new integration period.

The up-count terminal U is supplied with a clock signal CLK while the switch SW5 is closed by the up-count signal LO1 to count up clocks. The down-count terminal D is supplied with a clock signal CLK while the switch SW6 is closed by the down-count signal LO2 to count down clocks.

FIG. 6 is a timing diagram of the 0ch conversion section 100 shown in FIG. 5. A similar timing applies to the 1ch conversion section 200, in which, however, the order of the integration period and A/D conversion period is opposite to that shown, in FIG. 6.

As shown in FIG. 6, the timing signal TC1 is fed to the switch SW1 and the logic circuit 20 all the time during the integration period T1. The timing signal TC2 is fed to the switch SW4 and the counter 30 at the beginning of each new integration period. The timing signal TC3 is fed to the logic circuit 20 to control timing of the A/D conversion. Other timing signals are formed and utilized as needed.

In the integration period T1, the input positive signal i is integrated by the integrator 10, resulting in a gradually increasing integral output voltage ii. Receiving this integral output voltage ii, the comparative output iii of the comparator Cz remains at a low level.

Under this condition, the A/D conversion is started ahead of the A/D conversion period T2 at a point in time a predetermined time Tb prior to the termination of the integration period T1. In the example shown herein, since the comparative output iii is negative in polarity, the logic circuit 20 generates an up-count signal LO1.

The switch SW5 is first closed by the up-count signal LO1. While the switch SW5 is closed, clock signal CLK is supplied to the up-count terminal U of the U/D counter 30 to count up clocks. At the same time the switch SW2 is closed by the up-count signal LO1. While the switch SW2 is closed, the constant current Iu flows out of the condenser Ci of the integrator 10.

During the period Tb which begins with the generation of up-count signal LO1 and ends with the termination of the integration period T1, charging of the condenser by the input current Vin/Ri and discharging thereof by the constant current Iu proceed simultaneously. At the end of the integration period T1, the switch SW9 is switched from the input signal terminal i to the ground terminal g, and the switch SW1 is turned off.

Subsequently, through discharging of the constant current Iu, the integral output voltage ii is gradually decreased in absolute value until the voltage becomes zero Volt, at which point in time the comparative output iii of the comparator Cz is inverted. The logic circuit 20 stops up-count signal LO1 in response to the inversion of the comparative output iii, which in turn opens the switch SW5 to stop up-counting by the U/D counter 30 and opens the switch SW2 to stop the constant current Iu.

In this way, the value of integration indicative of the current of the input signal i is digitally counted in the form of clock pulses vi counted up, and output from the counter 30 as count data viii. It will be understood that time required for the A/D conversion of the integrated value can be reduced by starting the A/D conversion during the integration period T1. The A/D conversion of the input signal i can be carried out by performing a down-counting of the pulses if the signal is of negative polarity.

Referring to FIG. 4 showing the timing diagram of the first integration type A/D converter, the operation of the converter will now be described.

The switches SW9 and SW10 are periodically switched on and off in turn with a predetermined period T. This enables the input signal Vin to be fed alternately to the 0ch conversion section 100 or the 1ch conversion section 200.

In the first period T1, the input signal Vin is fed to the 0ch conversion section 100 for integration thereof. On the other hand, the 1ch conversion section 200 performs A/D conversion of the value of integration obtained in the preceding period. It should be understood that in FIG. 4, those periods marked ① represent integration periods and those marked ② represent period of A/D conversion. In this embodiment, A/D conversion of an integration is started during its integration period. This is also the case in other embodiments.

In the second period T2 following the first, the switches SW9 and SW10 are switched over with each other, so that the input signal Vin is fed to the 1ch conversion section 200 while the 0ch conversion section 100 performs A/D conversion of the integrated value of the input signal obtained in the preceding period.

In this manner integration of the input signal and A/D conversion of the integration value are carried out in turn in each of the 0ch conversion section 100 and 1ch conversion section 200 in the respective periods, providing the respective A/D conversion values k0 and k1 at the respective output terminals out0 and out1. The values k0 and k1 that result from the conversion sections connected to the switch SW8 are fed to the register 40. These values are added with additional information indicative of the content of the data before they are output from the register 40.

It is noted that the first embodiment of the integration type A/D converter has two sets of integration type A/D conversion sections 100 and 200, and that they are switched over with a predetermined period. While one A/D conversion section is undertaking the integration of the input signal, the other one performs the A/D conversion of the value of integration already obtained. Such dual processing of the input signal allows continuous integration, and hence the A/D conversion, of the input signal, thereby providing an accurate A/D conversion of the input signal based on actual measurement of the signal.

Figure 7:
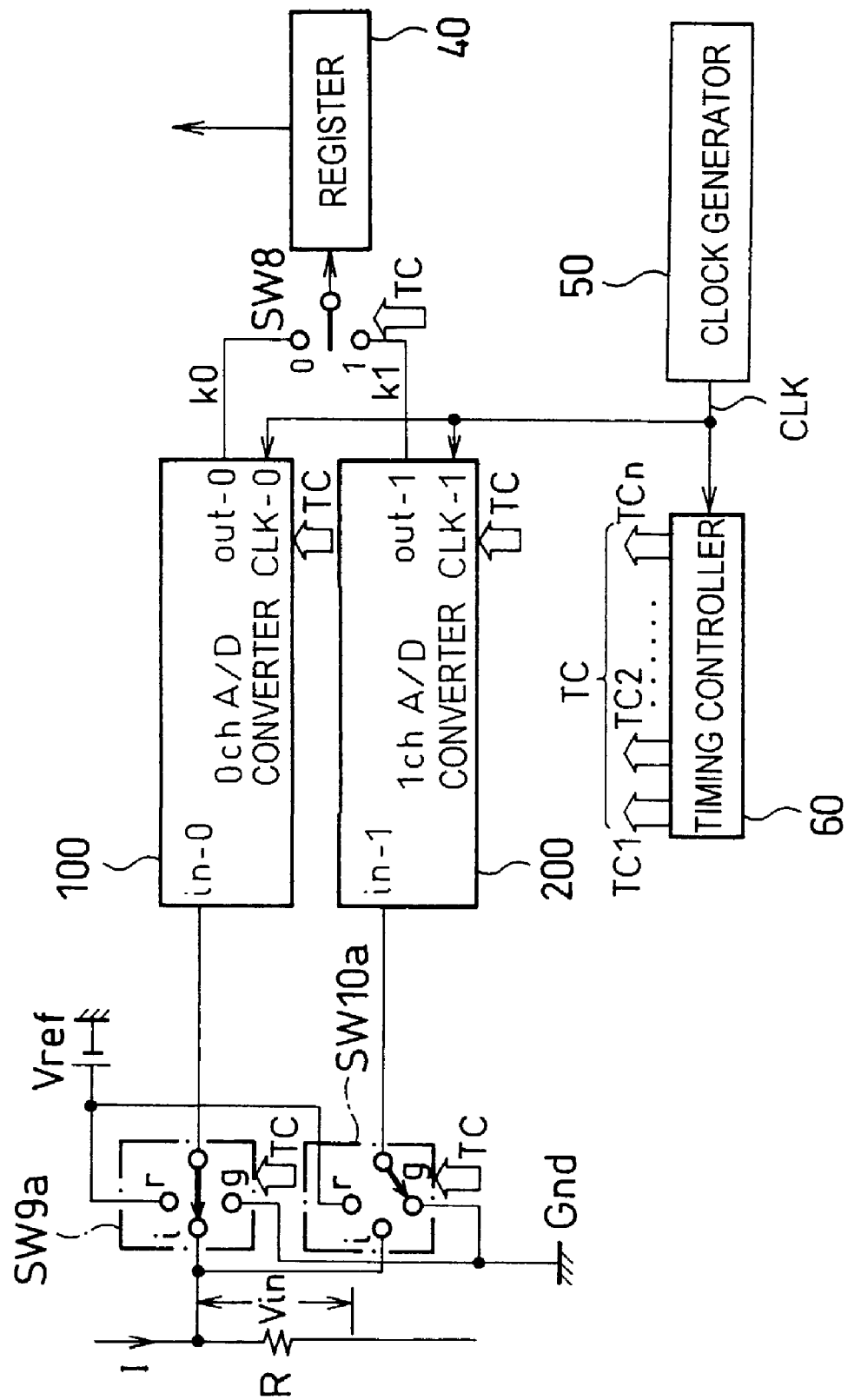
FIG. 7 is a block diagram representation of a second embodiment of an integration type A/D converter according to the invention.
Figure 8:
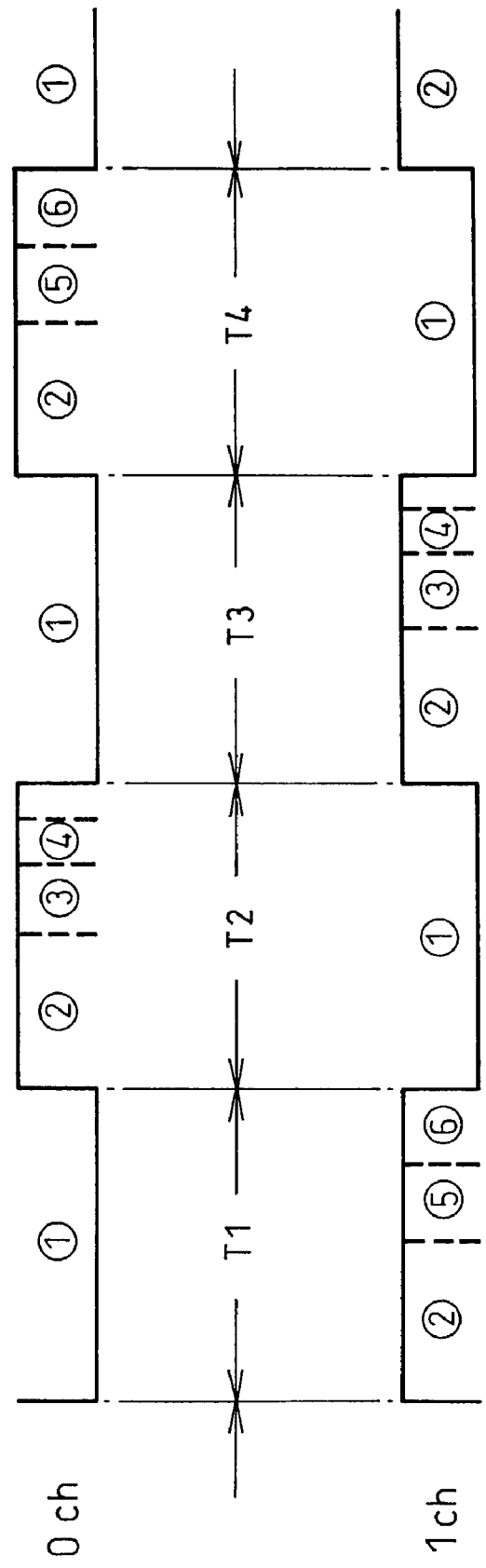
FIG. 8 is a timing diagram of the second embodiment of the integration type A/D converter.

FIG. 7 is a block diagram of a second embodiment of an integration type A/D converter of the invention. FIG. 8 is a timing diagram of the entire A/D converter.

As shown in FIG. 7, each of switches SW9a and SW10a has three switchable input terminals for selecting one of the input voltage Vin, ground voltage Vgnd, and a reference voltage Vref in response to the timing-signal TC.

The internal structures of the 0ch conversion section 100 and 1ch conversion section 200 are the same as the ones shown in FIGS. 5 and 6. However, in this embodiment, the timing signal TC1 is output to turn on the switch SW1 while the ground voltage Vgnd and the reference voltage Vref are integrated.

Further, while the ground voltage Vgnd and the reference voltage Vref are integrated for A/D conversion by means of the U/D counter 30 counting the clock pulses, an up-count signal LO1 (or down-count signal LO2) is output in accordance with the level of the integrated voltage. Structures and operations of other components are the same as in the first embodiment as shown in FIGS. 3–6, so that further details of the converter will not repeated here.

Operations of the second embodiment of an integrated A/D converter will now be described below with reference to a timing diagram shown in FIG. 8. It should be understood that the periods marked ① through ⑥ in FIG. 8 are respectively integration period for the input signal, period of A/D conversion of the integral output voltage for the input signal, a integration period for the ground voltage, a period of A/D conversion of the integrated ground voltage, a integration period for the reference voltage, and a period of A/D conversion of the integrated reference voltage.

Switches SW9a and SW10a are switched between the input voltage Vin, ground voltage Vgnd, and reference voltage Vref in accordance with the timing signal TC received from a timing controller 60.

The switch SW9a is connected in turn to the input voltage Vin during a first period T1, to the ground voltage Vgnd during a second period T2, to the input voltage Vin during a third period T3, and to the reference voltage Vref during a fourth period T4. The switch SW10a is connected in turn to the reference voltage Vref during the first period T1, to the input voltage Vin during a second period T2, and to the ground voltage Vgnd during the third period T3, and to the input voltage Vin during the fourth period T4.

In the first period T1, the 0ch conversion section 100 integrates the input voltage Vin (①). On the other hand, the 1ch conversion section 200 first performs A/D conversion of the input signal integrated in the preceding period (②), then integrates the reference voltage (⑤), and further performs A/D conversion of the integrated reference voltage (⑥).

In the second period T2, the 0ch conversion section 100 first performs A/D conversion of the input signal integrated in the preceding period T1 (②), then integrates the ground voltage (③), and further performs A/D conversion of the integrated ground voltage (④). By the A/D converter of the integrated ground voltage, an offset voltage is obtained. The 1ch conversion section 200 integrates the input voltage Vin (①).

In the third period T3, the 0ch conversion section 100 integrates the input signal Vin (①). On the other hand, the 1ch conversion section 200 first performs A/D converter of the input signal integrated in the preceding period T2 (②), then integrates the ground voltage (③), and further performs A/D converter of the integrated ground voltage (④).

In the fourth period T4, the 0ch conversion section 100 first further performs A/D converter of the input signal integrated in the preceding period T3 (②), then integrates the reference voltage (⑤), and further performs A/D converter of the integrated reference voltage (⑥). The 1ch conversion section 200 integrates the input signal Vin (①).

Each of the resultant values k0 and k1 of the respective A/D conversions is sequentially output from the respective output terminals out0 and out1. These values k0 and k1 are entered in the register 40 together with additional information indicative of the contents of the values k0 and k1 while the switch SW8 is connected. These values k0 and k1 are output from the register 40 together with the added information. Incidentally, the additional information may be constructed by the register 40.

The additional information is provided to help distinguish between the two outputs of the A/D conversions made in the two competing conversion sections, so that one of them is safely retrieved in the right order. The data format of the additional information is shown in FIG. 9.

As seen in FIG. 9, bit 1 is a polarity sign, bits 2–17 are A/D conversion data (count data), bit 18 is a set number identifying conversion section, bits 19–20 are data identification codes identifying input voltage, ground voltage and reference voltage, bits 21–22 are not reserved (not used).

In the invention, besides the input signal, ground voltage is integrated to determine the offset voltage of the input voltage.

In addition to the input signal, the reference voltage is also integrated to provide an integrated reference voltage. In order to minimize errors involved in the integral output voltage of the input signal, a data fluctuation ratio is calculated from the integrated reference voltage. By multiplying the integral output voltage of the input signal by the data fluctuation ratio, correction for the output voltage may be obtained, thereby realizing highly accurate measurement of the input signal.

Figure 10:
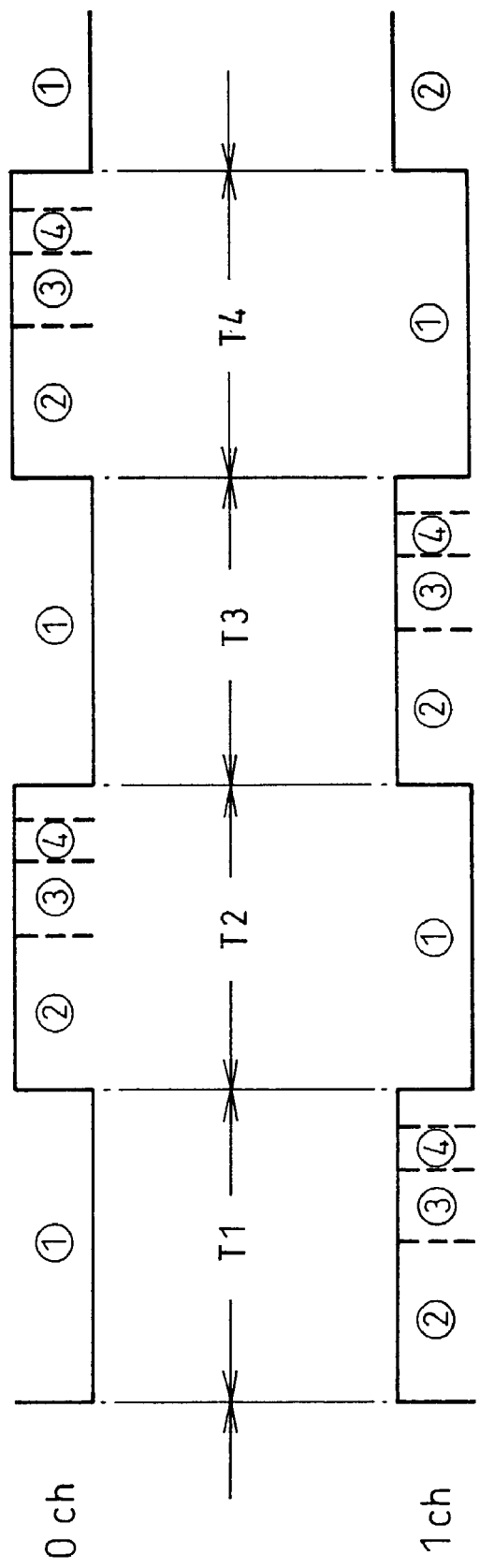
FIG. 10 is a timing diagram of the third embodiment of an integration type A/D converter.

FIG. 10 is a timing diagram for a third embodiment of an A/D converter of the invention. The structure of this A/D converter may be obtained from that of the second embodiment (FIG. 8) by removing the functions associated with the reference voltage integration and its A/D conversion. Hence, the structure is the same as that of the second embodiment shown in FIG. 7 except that the reference voltage Vref is removed and that the switches SW9a and SW10a have no connection to the reference voltage Vref.

Therefore, in the following description, only those operations unique to the third integration type A/D converter will be given with reference to the timing diagram of FIG. 10. Incidentally, the periods marked ① through ④ in FIG. 10 are respectively integration period for the input signal, period of A/D conversion of the integrated input signal, integration period for the ground voltage, and period of A/D conversion of the integrated ground voltage.

The switch SW9a is connected in turn to the input voltage Vin during a first period T1, to the ground voltage Vgnd during a second period T2, to the input voltage Vin during a third period T3, and to the ground voltage Vgnd during a fourth period T4. The switch SW10a is connected in turn to the ground voltage Vgnd during the first period T1, to the input voltage Vin during the second period T2, to the ground voltage Vgnd during the third period T3, and to the input voltage Vin during the fourth period T4.

In the first period T1, the 0ch conversion section 100 integrates the input voltage Vin (①). On the other hand, the 1ch conversion section 200 first performs A/D conversion of the input signal integrated in the preceding period (②), then integrates the ground voltage (③), and further performs A/D conversion of the integrated ground voltage (④).

In the second period T2, the 0ch conversion section 100 first performs A/D conversion of the input signal integrated in the preceding period T1 (②), then integrates the ground voltage (③), and further performs A/D conversion of the integrated ground voltage (④). The 1ch conversion section 200 integrates the input voltage Vin (①). Thereafter, in the third and fourth periods T3, T4, the same operations as in the first and second periods are repeated.

In this way, the 0ch conversion sections 100 and 200 undertake a sequence of integration of the input signal (①), A/D conversion of the integrated input signal (②), integration of the ground voltage (③), and A/D conversion of the integrated ground voltage (④) allocated in the respective periods. The values of the A/D conversions k0 and k1 are provided at their output terminals out0 and out1, respectively.

Figure 11:
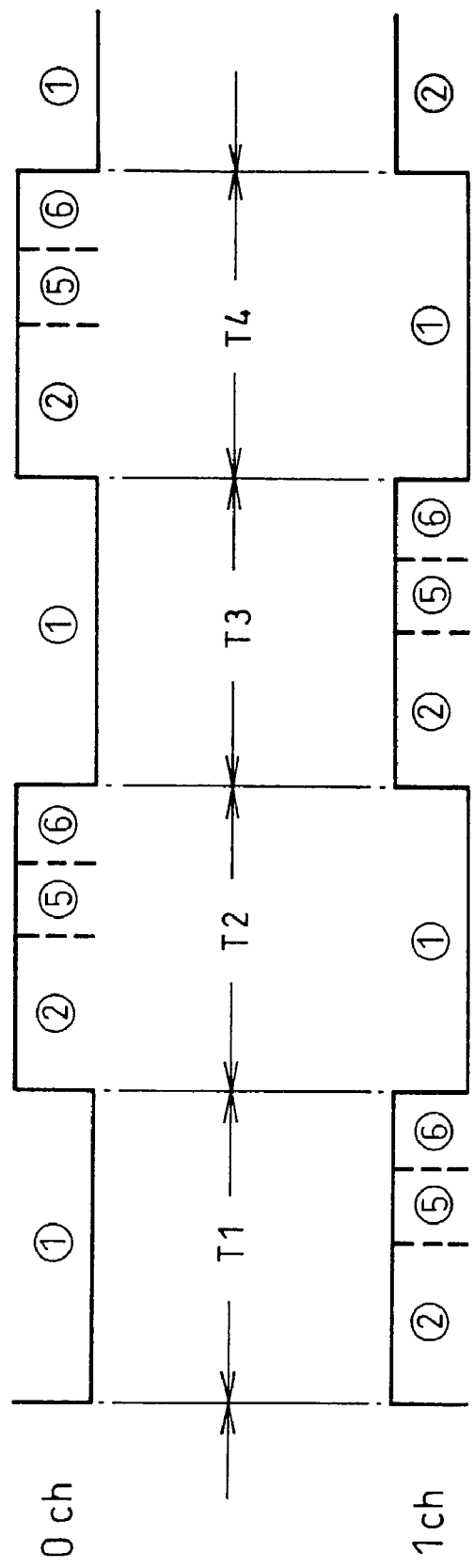
FIG. 11 is a timing diagram of the fourth embodiment of an integration type A/D converter.

FIG. 11 is a timing diagram for a fourth embodiment of an integration type A/D converter of the invention. The structure of the A/D converter corresponds to that of the second embodiment (FIG. 8) with its functions performing integration of the ground voltage and A/D conversion thereof removed. Hence, the structure is the same as that of the second embodiment shown in FIG. 7 except that the ground voltage Vgnd is removed and that the switches SW9a and SW10a have no connection to the ground voltage Vgnd.

Therefore, in the following description, only those operations unique to the fourth integration type A/D converter will be given with reference to the timing diagram of FIG. 11. In FIG. 11, period marked ① is the integration period for the input signal, period marked ② is the period for A/D conversion of the integrated input signal, period marked ⑤ is the integration period for the reference voltage, period marked ⑥ is the period for A/D conversion of the integrated reference voltage.

The switch SW9a is connected in turn to the input voltage Vin during a first period T1, to the reference voltage Vref during a second period T2, to the input voltage Vin during a third period T3, and to the reference voltage Vref during a fourth period T4. The switch SW10a is connected in turn to the reference voltage Vref during the first period T1, to the input voltage Vin during the second period T2, to the reference voltage Vref during the third period T3, and to the input voltage Vin during the fourth period T4.

In the first period T1, the 0ch conversion section 100 integrates the input voltage Vin (①). On the other hand, the 1ch conversion section 200 first performs A/D conversion of the input signal integrated in the preceding period (②), then integrates the reference voltage (⑤), and further performs A/D conversion of the integrated reference voltage (⑥).

In the second period T2, the 0ch conversion section 100 first performs A/D conversion of the input signal integrated in the preceding period T1 (②), then integrates the reference voltage (⑤), and further performs A/D conversion of the integrated reference voltage (⑥). The 1ch conversion section 200 integrates the input voltage Vin (①). Thereafter, in the third and fourth periods T3, T4, the same operations as in the first and second periods are repeated.

In this way, the 0ch conversion sections 100 and 200 undertake a sequence of integration of the input signal (①), A/D conversion of the integrated input signal (②), integration of the reference voltage (⑤), and A/D conversion of the integrated reference voltage (⑥) allocated in the respective periods. The values of the A/D conversions k0 and k1 are provided at their output terminals out0 and out1, respectively.

Figure 12:
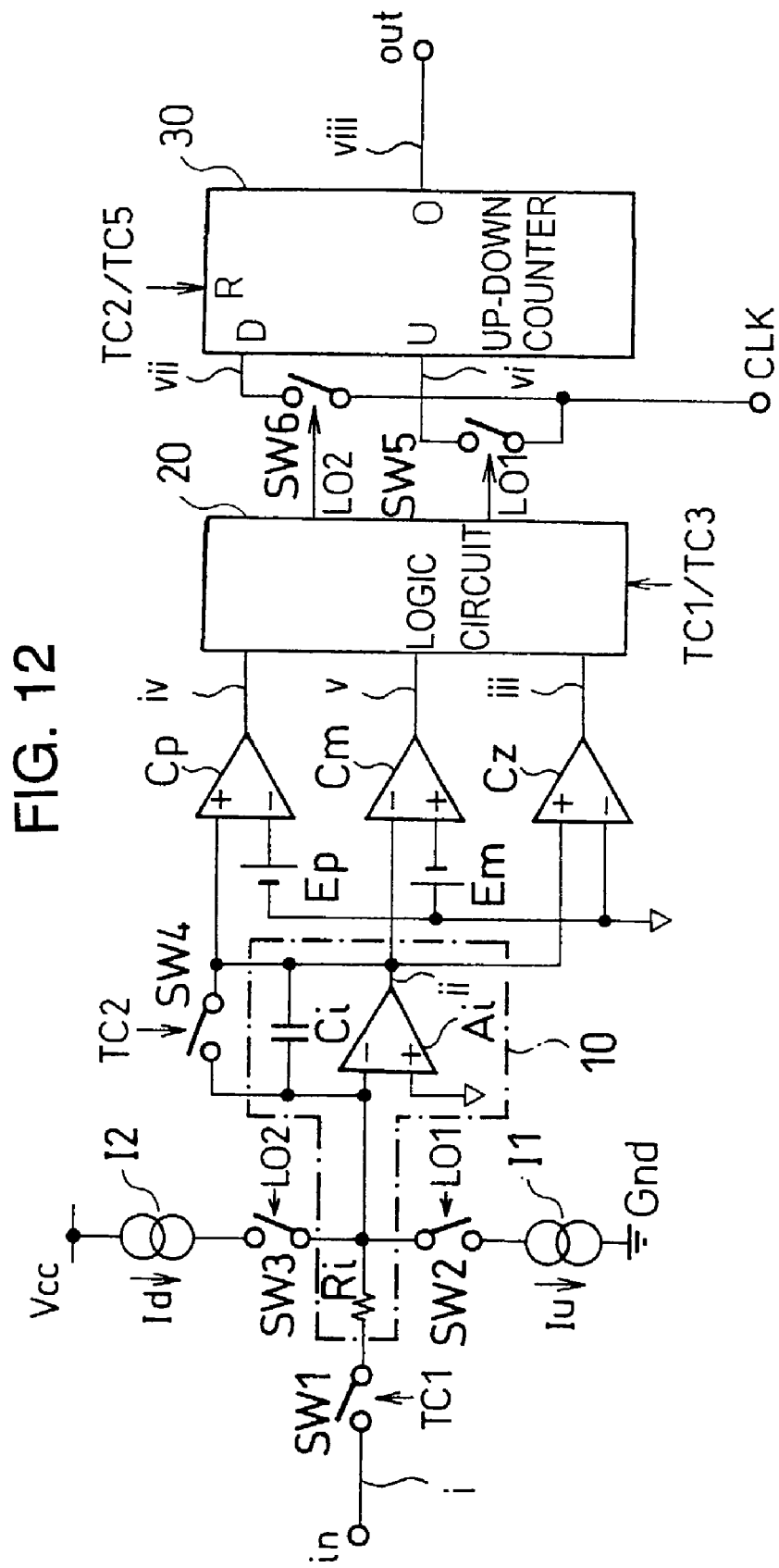
FIG. 12 is a block diagram representation of a fifth embodiment of an integration type A/D conversion section according to the invention.
Figure 13:
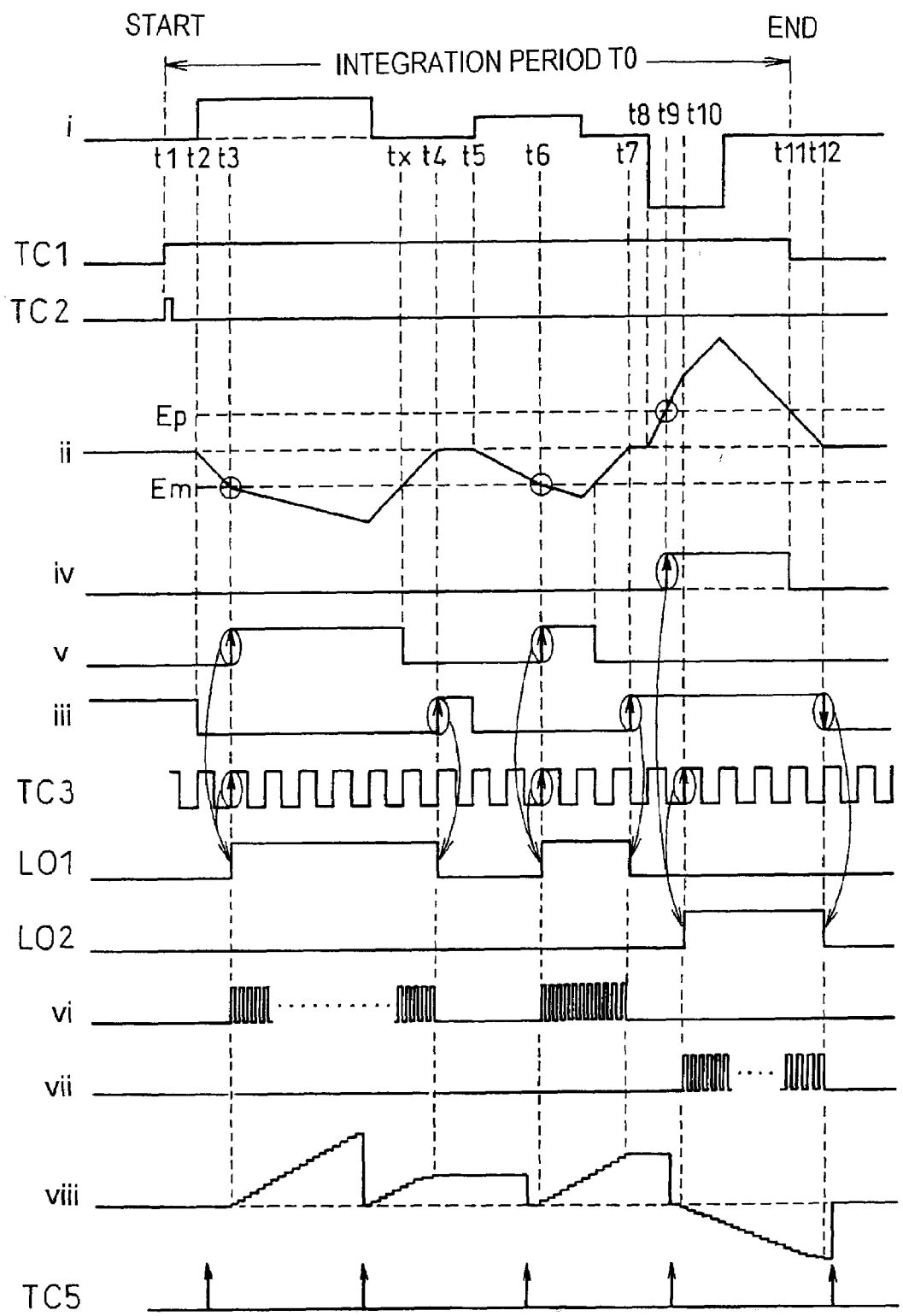
FIG. 13 is a timing diagram of the integration type A/D conversion section of FIG. 12.

FIG. 12 shows an internal structure of a fifth embodiment of an integration type A/D converter of the invention. FIG. 13 is a timing diagram of the A/D conversion section of the converter shown in FIG. 12.

Figure 14:
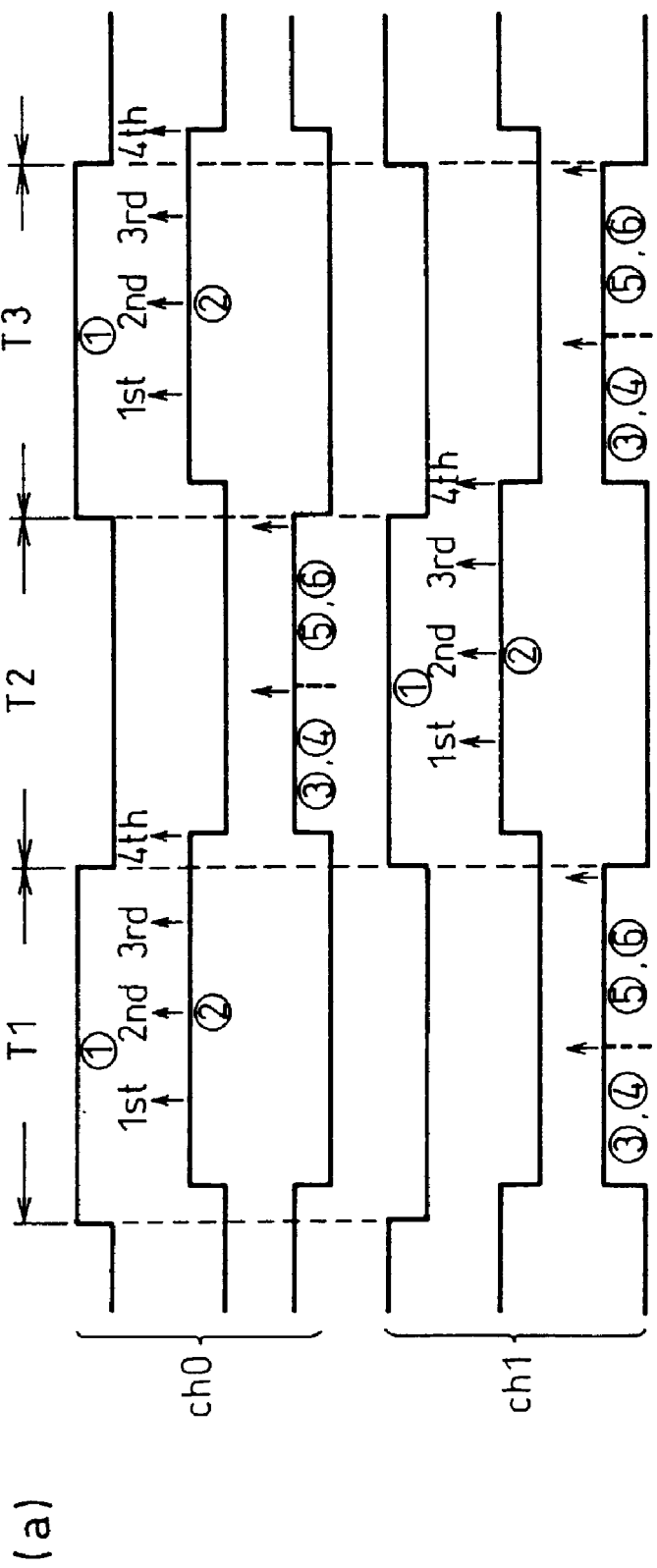
FIG. 14 is a timing diagram of the fifth embodiment of the integration type A/D converter according to the invention.

FIG. 14 is a timing diagram for the fifth embodiment of an integration type A/D converter. The structure of the fifth integration type A/D converter is the same as the one shown in FIG. 7.

As compared with the one shown in FIG. 5, the A/D conversion section of FIG. 12 further includes a first comparator Cm and a third comparator Cp, besides the second comparator Cz for outputting the second comparative output iii.

The first comparator Cm is supplied at the inverting input terminal thereof with the integral output voltage ii and at the non-inverting input terminal with a predetermined negative voltage Em, and generates a first comparative output v when the integral output voltage ii exceeds in absolute value the voltage Em. The second comparator Cz is provided at the non-inverting input terminal thereof with the integral output voltage ii and at the inverting input terminal with the ground voltage Vgnd or a bias voltage, and outputs the integral output voltage ii or an inverted version of the comparative output iii depending on whether the integral output voltage ii is positive or negative. It is noted that since the second comparator Cz is provided to determine if the integral output voltage ii crosses the zero voltage, the comparator Cz can be any means so long as it fulfills this function. The third comparator Cp is provided at the non-inverting terminal thereof with the integral output voltage ii and at the inverting input terminal with a predetermined positive voltage Ep, and outputs a third comparative output iv when the integral output voltage ii exceeds the voltage Ep.

Because the first through the third comparators Cm, Cz, and Cp constitute the circuit of comparator, the up-count signal LO1 is turned on during a period which begins with the generation of the first comparative output v and ends with the inversion of the second comparative output iii, or, when the second comparative output iii is LOW (which corresponds to a negative integral output voltage), a period beginning with the completion of an integration period of the A/D converter and ending with the inversion of the second comparative output iii to HIGH.

The down-count signal LO2 is turned on during a period which begins with the generation of the third comparative output iv and ends with the inversion of the second comparative output iii, or, when the second comparative output iii is HIGH (which corresponds to the positive integral output voltage), a period beginning with the completion of the integration period of the A/D converter and ending with the inversion of the second comparative output iii to LOW.

FIG. 13 is a timing diagram for the operations of the A/D conversion sections 100 and 200 of FIG. 12. Operations of the A/D conversion sections 100 and 200 will now be described with additional reference to FIGS. 7 and 12.

When an integration period is started at time t1, a timing signal TC1 is supplied by the timing controller 60 to the switch SW1 to close the switch during the integration period. At the same time, in order to discharge the electric charge remaining on the condenser Ci and reset the counter 30, the timing controller 60 supplies a timing signal TC2 to the switch SW4 and the U/D counter 30.

As the integration period is started, the magnitude of the integration output voltage is increased by a positive input signal i in the negative direction. At time t3, when the integral output voltage ii exceeds in the negative direction the bias voltage Em of the first comparator Cm, the first comparative output v rises, which output is fed to the logic circuit 20. The logic circuit 20 generates an up-count signal LO1 through AND operation on the first comparative output v and the timing signal TC3 (which is timing the A/D conversion).

The up-count signal LO1 is first supplied to the switch SW5 to close the switch. While the switch SW5 is closed, clock pulses are supplied by the clock pulse generator 50 to the up-count terminal U of the U/D counter 30, causing the U/D counter 30 to count up the pulses. At the same time, the up-count signal LO1 is also supplied to the switch SW2 to close the switch. While the switch SW2 is closed, a constant current Iu is output from the condenser Ci of the integrator 10. In other words, a current that amounts to the difference between the current indicative of the input signal and the constant current Iu flows into or out of the condenser Ci, charging or discharging the condenser Ci.

Discharging of constant current Iu results in gradual decrease in absolute value of the integral output voltage ii until it lowers below the bias voltage Em of the first comparator Cm at time tx say, when the first comparative output v of the comparator Cm falls (shifting to LOW). However, the operation of the circuit remains unchanged at this moment. As the integral output voltage ii further decreases in absolute value to zero potential of the second comparator Cz at time t4, the second comparative output iii is inverted. The inverted output iii is fed to the logic circuit 20. In response to the inversion of the second comparative output iii, the logic circuit 20 stops the up-count signal LO1. This causes the switch SW5 to be opened, which in turn causes the U/D counter 30 to stop up-count operation, and opens the switch SW2, thereby stopping the constant current Iu.

Thus, discharging and charging by the constant currents Iu and up-counting are executed in parallel with the integration of the input signal Vin. As a result, A/D conversion proceeds simultaneously with the integration of the input signal Vin.

Operations during a period from t4 to t7 shown in FIG. 13 are similar to those described above, except that the count for the period is not reset, so that further details of the operations will be omitted.

As seen in FIG. 13, when an input signal i of negative polarity is supplied at time t8, integral output voltage ii begins to increase in the positive direction. At time t9 when the integral output voltage ii exceeds the bias voltage Ep of the third comparator Cp, the third comparative output iv rises. The third comparative output iv is supplied to the logic circuit 20. The logic circuit 20 generates a down-count signal LO2 at time t10 when the logic circuit 20 receives both the third comparative output iv and the timing signal TC3.

The down-count signal LO2 is first supplied to the switch SW6 to close it. While the switch SW6 is closed, a clock signal from the clock generator 50 is supplied to the down-count terminal D of the U/D counter 30 to count down the count of the counter 30. At the same time, down-count signal LO2 is supplied to the switch SW3 to close it. While the switch SW3 is closed, the constant current Id flows into the condenser Ci of the integrator 10.

The integral output voltage ii is gradually decreased in absolute value by charging the constant current Id until it becomes below the bias voltage Ep of the third comparator Cp, which causes the third comparative output iv of the third comparator Cp to fall. At this stage, nothing changes in the operations of the A/D converter.

If the current integration period has come to an end at an intermediate time t11 say while the integral output voltage ii is decreased in absolute value by charging the constant current Id, the timing signal TC1 from the timing controller 60 is turned off at this moment t11, and the switch SW1 is opened.

However, at this moment t11, since the A/D conversion is in the middle of the conversion process, the A/D conversion is continued thereafter if the integration period has ended. As the integral output voltage ii is further decreased in absolute value and reaches zero potential of the second comparator Cz at t12, the comparative output iii is inverted, which output is fed to the logic circuit 20. In the logic circuit 20, the down-count signal LO2 is stopped by the inversion of the comparative output iii. This causes the switch SW6 to be opened, the U/D counter 30 to stop its down-counting, the switch SW3 to be opened to stop the constant current Id.

The up-count pulses vi and down-count pulses vii during this period are shown in FIG. 13. The resultant count data viii of the U/D counter 30 is output therefrom. The count data viii of the U/D counter 30 is output therefrom in response to the timing signal TC5, for example, generated periodically at a predetermined period. The U/D counter 30 may be adapted to be rest every time it outputs its count, and start a new count. This arrangement permits minimization of the digits of the U/D counter 30, which helps improve the accuracy of counting by the U/D counter 30.

Referring to FIGS. 7, 12 and 13, operations of a fifth embodiment of an integration type A/D converter will now be described. A further reference will be made to FIG. 14 showing a timing diagram of the converter.

As seen in FIG. 14(a), the switches SW9a and SW10a are selectively connected to either one of the input voltage Vin, ground voltage Vgnd, and the reference voltage Vref, in accordance with the timing signal TC received from the timing controller 60.

The switch SW9a is connected in turn to the input voltage Vin during a first period T1, to the ground voltage Vgnd and the reference voltage Vref during the respective first and the second halves of the second period T2, and again to the input voltage Vin during a third period T3. The switch SW10a is connected in turn to the ground voltage Vgnd and to the reference voltage Vref during the respective first and the second halves of a first period T1, to the input voltage Vin, during a second period T2, and again to the ground voltage Vgnd and the reference voltage Vref during the respective first and the second halves of a third period T3.

The 0ch conversion section 100 integrates the input voltage Vin to obtain the integral output voltage during the first period T1, and begins the A/D conversion of the integral output voltage at some point in the period T1. The A/D conversion proceeds as described previously in connection with FIGS. 12 and 13. The conversion will be ended a predetermined short period of time after the end of the first period T1. In the first period T1, the 1ch conversion section 200 integrates the ground voltage (③) and performs A/D conversion of the integrated ground voltage (④) in the first half of the period T1. The conversion section 200 also integrates the reference voltage (⑤) and performs the A/D conversion of the integrated reference voltage (⑥) in the second half of the period T1.

It is noted in FIG. 14 that the periods marked ① through ⑥ are respectively integration period for the input signal, period of A/D conversion of the integrated input signal, a integration period for the ground voltage, a period of A/D conversion of the integral offset value, a integration period for the reference voltage, and a period of A/D conversion of the integrated reference voltage. Each of the integration periods ①, ③, and ⑤ is provided, in parallel, with the respective associated A/D conversion period ②, ④, and ⑥ for the A/D conversion to be performed simultaneously therewith.

In the second period T2, the 1ch conversion section 200 integrates the input signal Vin and starts the A/D conversion of the integral output voltage in the same period. The A/D conversion will be finished within a predetermined short time after the end of the second period T2. In the second period T2, the 0ch conversion section 100 integrates the ground voltage in the first half the period (③), performs the A/D conversion of the integrated ground voltage (④), and in the second half of the period integrates the reference voltage (⑤), and performs the A/D conversion of the integrated reference voltage (⑥).

In the third and fourth periods T3 and T4, the same processing proceeds as in the first and the second periods T1 and T2, respectively.

The resultant data issued from the 0ch conversion section 100 and 1ch conversion section 200 are sequentially output therefrom. As shown in FIG. 14(b), the results of the A/D conversion for the input signal Vin are output a multiplicity of times (four times in the example shown herein) during the same period. Every time the result of A/D conversion is output, the count of the U/D counter 30 is reset and a new count is started.

Thus, the scale of the count can be small for the U/D counter 30. In other words, accuracy of count per one count can be improved on the same count scale.

It should be appreciated that the periods other than those allocated for the integration of the input voltage Vin and for its A/D conversion can be allocated for integration of the ground voltage, its A/D conversion, integration of the reference voltage, and its A/D conversion, so that the measurement of the offset value and its integration can be made with a high precision. Accordingly, the offset correction and the reference correction can be made appropriately and accurately for the integral output voltage of the input voltage.

The values k0 and k1 that result from the conversion sections connected to the switch SW8 are fed to the register 40. These valued are added with additional information indicative of the content of the data before they are from the register 40, as described in conjunction with FIG. 9. In the example shown herein, the additional information includes stage codes, $1^{st}$–$4^{th}$, in bits 21 and 22 which have not been used so far.

It is noted that in the fifth embodiment constant current Iu and Id are flown to decrease, in absolute value, the integral output voltage ii at the very moment when the integral output voltage ii has reached the predetermined values Em and Ep, so that the dynamic range of the A/D conversion can be extended. As a result, through adjustment of gains of amplifiers, a high precision A/D conversion of a given input signal can be attained.

Since a constant current Iu or Id is flown in the direction to decrease the integral output voltage ii, depending on the polarity of the output of the integrator 10, and rendering the U/D counter 30 to count up or down the count, integration of the input current of both polarity can be made with a single converter.

Each of the integration type A/D converters of the invention as described above can be advantageously utilized in a battery charger. By the use of the A/D converter in a battery charger, accurate measurements of integrated values of charging and discharging current can be attained with a reduced cost.

What we claim is:

1. An integration type A/D converter, comprising:
a first integration type A/D conversion section for providing an A/D conversion data, said A/D conversion section adapted to integrate a supplied signal to generate an integral output voltage, bringing said integral output voltage back to the initial level thereof by a predetermined magnitude per unit time, and measuring the time to restore said initial level, said A/D conversion section further adapted to provide said measured time as said A/D conversion data;
a second integration type A/D conversion section for providing an A/D conversion data, said A/D conversion section adapted to integrate a supplied signal to generate an integral output voltage, bringing said integral output voltage back to the initial level thereof by a predetermined magnitude per unit time, and measuring the time to restore said initial level, said A/D conversion section further adapted to provide said measured time as said A/D conversion data;
an input section receiving an input signal, adapted to alternately supply said input signal to said first integration type A/D conversion section and said second A/D conversion section during predetermined periods;
an output section receiving from said first integration type A/D conversion section said first A/D conversion data for said input signal and receiving from said second integration type A/D conversion section said second A/D conversion data for said input signal, said output section adapted to output said first and second A/D conversion data; and
a control section connected to said input section, said first integration type A/D conversion section, said second integration type A/D conversion section, and said output section, to control each of said sections,
wherein said output section is adapted to add to said A/D conversion data additional information indicative of the contents of said data including positive/negative sign and conversion identification codes, and further adapted to output said added information together with said A/D conversion data in a predetermined format.

2. An integration type A/D converter, comprising:
a first integration type A/D conversion section for providing an A/D conversion data, said A/D conversion section adapted to integrate a supplied signal to generate an integral output voltage, bringing said integral output voltage back to the initial level thereof by a predetermined magnitude per unit time, and measuring the time to restore said initial level, said A/D conversion section further adapted to provide said measured time as said A/D conversion data;
a second integration type A/D conversion section for providing an A/D conversion data, said A/D conversion section adapted to integrate a supplied signal to generate an integral output voltage, bringing said integral output voltage back to the initial level thereof by a predetermined magnitude per unit time, and measuring the time to restore said initial level said A/D conversion section, further adapted to provide said measured time as said A/D conversion data;
an input section receiving an input signal, adapted to alternately supply said input signal to said first integration type A/D conversion section and said second A/D) conversion section during predetermined periods, said input section equipped with a reference signal and further adapted to supply said reference signal to either one of said first and second integration type A/D conversion sections which is not currently receiving said input signal;
an output section receiving from said first integration type A/D conversion section said first A/D conversion data for said input signal and said A/D conversion data for said reference signal and receiving from said second integration type A/D conversion section said second A/D conversion data for said input signal and A/D conversion data for said reference signal, said output section adapted to output said A/D conversion data received; and
a control section connected to said input section, said first integration type A/D conversion section, said second integration type A/D conversion section, and said output section to control each of said sections; wherein
said output section is adapted to add to said A/D conversion data additional information indicative of the contents of said data including positive/negative sign and conversion identification codes, and further adapted to output said added information together with said A/D conversion data in a predetermined format.

3. An integration type A/D converter, comprising:
a first integration type A/D conversion section for providing an A/D conversion data, said A/D conversion section adapted to integrate a supplied signal to generate an integral output voltage, bringing said integral output voltage back to the initial level thereof by a predetermined magnitude per unit time, and measuring the time to restore said initial level, said A/D conversion section further adapted to provide said measured time as said A/D conversion data;
a second integration type A/D conversion section for providing an A/D conversion data, said A/D conversion section adapted to integrate a supplied signal to generate an integral output voltage, bringing said integral output voltage back to the initial level thereof by a predetermined magnitude per unit time, and measuring the time to restore said initial level, said A/D conversion section further adapted to provide said measured time as said A/D conversion data;
an input section receiving an input signal, adapted to alternately supply said input signal to said first integration type A/D conversion section and said second A/D conversion section during predetermined periods, said input section equipped with a reference signal and further adapted to supply said reference signal to either one of said first and second integration type A/D conversion sections which is not currently receiving said input signal;
an output section receiving from said first integration type A/D conversion section said first A/D conversion data for said input signal and said A/D conversion data for said reference signal, and receiving from said second integration type A/D conversion section said second A/D conversion data for said input signal and A/D conversion data for said reference signal, said output section adapted to output said A/D conversion data received; and a control section connected to said input section, said first integration type A/D conversion section, said second integration type A/D conversion section, and said output section, to control each of said sections; wherein said input section has a first reference signal of a nominal voltage (referred to as reference voltage) and a second reference signal of said ground voltage, and said output section is adapted to receive said A/D conversion data for said input signal, said A/D conversion data for said reference voltage, and said A/D conversion data for said ground voltage from said first arid second integration type A/D conversion sections, said further adapted to output said data received.

4. The integration type A/D converter according to claim 3, wherein said input section is adapted to supply said reference voltage and said ground voltage alternately to said first and second integration type A/D conversion sections within one predetermined period.

5. The integration type A/D converter according to claim 3, wherein said input section is adapted to supply said reference voltage to one of said first and second integration type A/D conversion sections in one predetermined period, and supply said ground voltage to the other one of said first and second integration type A/D conversion sections in another predetermined period.

6. A battery charger having an integration type A/D converter, wherein said integration type A/D converter includes:

a first integration type A/D conversion section for providing an A/D conversion data, said A/D conversion section adapted to integrate a supplied signal to generate an integral output voltage, bringing said integral output voltage back to the initial level thereof by a predetermined magnitude per unit time, and measuring the time to restore said initial level, said A/D conversion section further adapted to provide said measured time as said A/D conversion data;

a second integration type A/D conversion section for providing an A/D conversion data, said A/D conversion section adapted to integrate a supplied signal to generate an integral output voltage, bringing said integral output voltage back to the initial level thereof by a predetermined magnitude per unit time, and measuring the time to restore said initial level, said A/D conversion section further adapted to provide said measured time as said A/D conversion data;

an input section receiving an input signal, adapted to alternately supply said input signal to said first integration type A/D conversion section and said second A/D conversion section during predetermined periods, said input section equipped with a reference signal and further adapted to supply said reference signal to either one of said first and second integration type A/D conversion sections which is not currently receiving said input signal;

an output section receiving from said first integration type A/D conversion section said first A/D conversion data for said input signal and said A/D conversion data for said reference signal, arid receiving from said second integration type A/D conversion section said second A/D conversion data for said input signal and A/D conversion data for said reference signal, said output section adapted to output said A/D conversion data received; and a control section connected to said input section, said first integration type A/D conversion section, said second integration type A/D conversion section, and said output section, to control each of said sections, wherein said output section is adapted to add to said A/D conversion data additional information indicative of the contents of said data including positive/negative sign and conversion identification codes, and further adapted to output said added information together with said A/D conversion data in a predetermined format.

* * * * *